United States Patent [19]

Kozono

[11] Patent Number: 5,075,753
[45] Date of Patent: Dec. 24, 1991

[54] SEMICONDUCTOR INTEGRATED CIRCUIT DEVICE

[75] Inventor: Kazuhiko Kozono, Mitaka, Japan
[73] Assignee: Hitachi, Ltd., Tokyo, Japan
[21] Appl. No.: 450,897
[22] Filed: Dec. 14, 1989

[30] Foreign Application Priority Data

Dec. 27, 1988 [JP] Japan .................................. 63-334849

[51] Int. Cl.$^5$ ............................................ H01L 27/10
[52] U.S. Cl. ........................................ 357/45; 357/65; 357/68; 357/71
[58] Field of Search .................. 357/45, 68, 24, 23.13, 357/71, 40, 65, 70, 42, 40, 41

[56] References Cited

U.S. PATENT DOCUMENTS

| 4,746,966 | 5/1988 | Fitzgerald et al. | 357/45 X |
| 4,958,222 | 9/1990 | Takakura et al. | 357/40 X |
| 4,970,572 | 11/1990 | Kato et al. | 357/71 |

FOREIGN PATENT DOCUMENTS 63-152163 6/1988 Japan .

OTHER PUBLICATIONS

ISSCC Digest of Technical Papers, Feb. 1988, pp. 72-73.

Primary Examiner—Rolf Hille
Assistant Examiner—Roy Potter
Attorney, Agent, or Firm—Pennie & Edmonds

[57] ABSTRACT

A semiconductor integratedd circuit device adopting a master slice scheme, having a cell array in which basic cells are arrayed in a matrix shape and on which first power source wiring lines, second power source wiring lines and third power source wiring lines are respectively stacked in succession from a lowermost layer toward an uppermost layer, the first power source wiring lines and the third power source wiring lines being both extended in a column direction while the second power source wiring lines are extended in a row direction; wherein second contact holes for connecting the second power source wiring line and the third power source wiring line are arranged, when viewed in plan, around first contact holes for connecting the first power source wiring line and the second power source wiring line, in a region in which the first power source wiring line, the second power source wiring line and the third power source wiring line intersect.

The second contact holes are not arranged in those regions around the first contact holes into which the first contact holes shift in the extending direction of the second power source wiring line.

In addition, the first contact holes and the second contact holes are automatically formed by placing first contact hole cells and second contact hole cells in a design automation system, respectively.

35 Claims, 10 Drawing Sheets

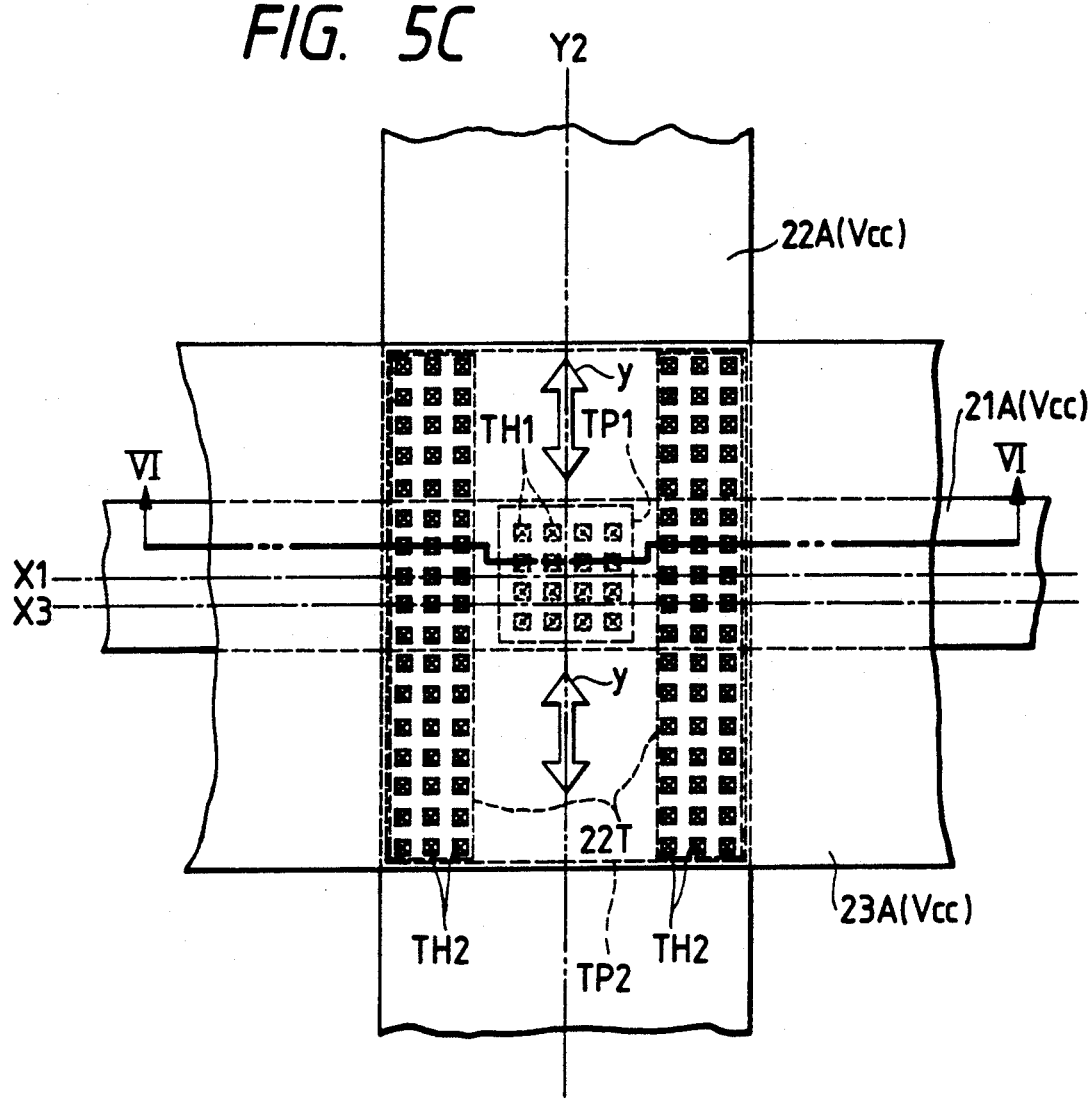
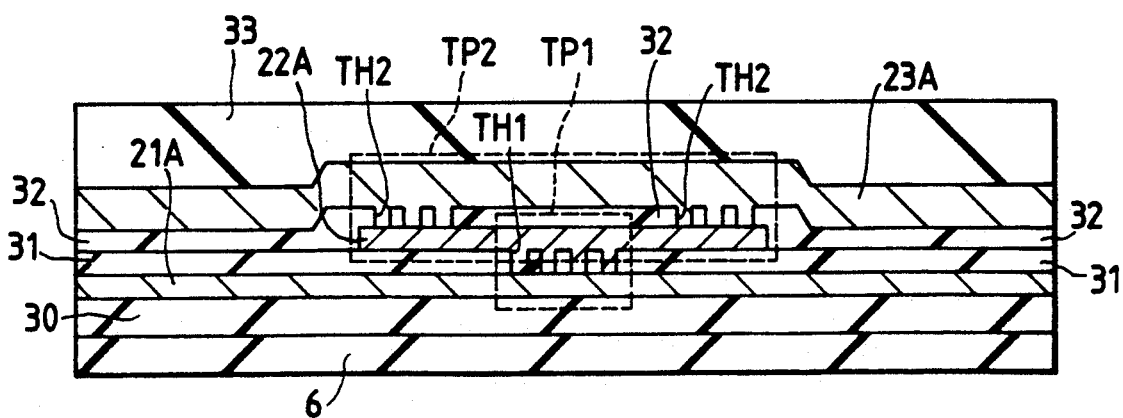

SEMICONDUCTOR INTEGRATED CIRCUIT DEVICE

BACKGROUND OF THE INVENTION

The present invention relates to the connections among wiring lines in semiconductor integrated circuit devices, and more particularly to techniques which are effective when applied to a semiconductor integrated circuit device adopting a master slice scheme.

A semiconductor integrated circuit device adopting the master slice scheme is such that connections are done within and among basic cells regularly arrayed in a matrix shape, by the use of a plurality of layers of signal wiring. Although the functions and arrayal of the basic cells are substantially fixed, the connection pattern of the signal wiring can be altered to achieve a required logic. Therefore, the semiconductor integrated circuit device adopting the master slice scheme permits many kinds of products to be developed in a short period of time merely by altering the connection pattern.

In the semiconductor integrated circuit device adopting the master slice scheme, the connection pattern of the signal wiring is formed by a computerized DA (Design Automation) system. In the DA system (which is an automatic placement and routing system), the following processing steps are executed:

First, on the basis of a designed logic circuit diagram, logic circuit information items are input to the DA system.

Subsequently, the DA system places or allocates basic cell patterns, stored as fixed patterns in a data base, on a data base model of the target semiconductor integrated circuit device (a base chip). Also, on the basis of the input logic circuit information items, the connection patterns of logic circuits are placed within the basic cell patterns (wiring lines within basic cells are placed). The connection patterns of the logic circuits construct, at least, parts of these logic circuits. The placement of the connection patterns of the logic circuits is automatically effected by the DA system.

Next, the DA system connects the individual logic circuits with signal wiring lines by automatic routing, to implement complete logic items which are to be included in the semiconductor integrated circuit device.

Next, the information items of the logic items implemented by the DA system are converted into data for mask production on the basis of design rules within this DA system.

Thereafter, a mask for connections is produced by, for example, an electron-beam lithographic apparatus on the basis of the data for mask production A device process is performed using the connecting mask, thereby to complete the semiconductor integrated circuit device which includes the predetermined logic items.

SUMMARY OF THE INVENTION

In the semiconductor integrated circuit device adopting the master slice scheme of this type, the number of gates increases because of a heightened density of integration. Therefore, the number of gates per unit area tends to increase, and the density of electric current in a basic cell array tends to increase in turn. In the semiconductor integrated circuit device adopting the master slice scheme, power source wiring lines are extended at the outer periphery of the basic cell array, while auxiliary power source wiring lines are extended within the basic cell array. Input/output buffer circuits are arranged at the outer periphery of the basic cell array, and the power source wiring lines are laid on the input/output buffer circuits. The auxiliary power source wiring lines can alleviate the electric current density within the basic cell array so as to reduce the influence of electromigration, which in turn enhances the electrical reliability of the semiconductor integrated circuit device. A technique for placing the auxiliary power source wiring lines is described in, for example, the official gazette of Japanese Patent Application Laid-Open No. 152163/1988.

However, in the semiconductor integrated circuit device adopting the master, slice scheme explained hereinabove, the inventor has discovered the occurrence of a problem which is discussed below:

The auxiliary power source wiring lines are set and stored as fixed pattern information in the data base of the DA system. That is, differing completed physical semiconductor integrated circuit devices have the same extending positions of their auxiliary power source wiring lines even though they are separate kinds of products which have different logic items. Furthermore, the number and size (chiefly cross-sectional area) of each of the auxiliary power source wiring lines are designed assumed a worst case density. In consequence, the auxiliary power source wiring lines designed for the worst case extend even in a region of low current density, and accordingly the occupation area of the auxiliary power source wiring lines is raised, which in turn lowers the achievable packing density of the logic circuits.

To overcome this problem, a semiconductor integrated circuit device adopting the master slice scheme under development by the inventor employs the following technique which is not known in the prior art. This technique functions to arrange the number of the auxiliary power source wiring lines and the size of each wring line are varied depending upon the corresponding logic circuit's predicted electric current density. This reduces in number and size the auxiliary power source wiring lines to enhance the packaging rate of logic circuits. In the semiconductor integrated circuit device adopting the master slice scheme, the connection patterns of the logic circuits (wiring lines within basic cells) and the connection patterns among the logic circuits in the column direction thereof formed in a first layer of wiring. Cellular power source wiring lines for supplying power source voltages to the individual elements of the logic circuits are also arranged in the first layer of wiring, and they are extended in the column direction similarly to the connection patterns. In addition, the connection patterns among the logic circuits in the row direction thereof are formed in a second layer of wiring. Also, the connection patterns among the logic circuits to be formed in a third layer of wiring are extended in the column direction. The auxiliary power source wiring lines are formed in the second wiring layer and the third wiring layer in order to lower the electric current density. The auxiliary power source wiring lines to be formed in the second wiring layer are laid in the same row direction as that of the connection patterns which are extended in the row direction for the connections among the logic circuits. The auxiliary power source wiring lines to be formed in the third wiring layer are laid in the column direction. In other words, the semiconductor integrated circuit device adopting the master slice scheme under development by the inventor is constructed of a three-layer power source wiring structure. The power source wiring lines of the respective layers are electrically connected through contact holes which are formed in inter-layer insulator films. The arrangement number of the auxiliary power source wiring lines and the size of each wiring line are automatically set by the DA system.

There is a problem with the above-described method, though. Namely, each time the arrangement number of the auxiliary power source wiring lines and the size of each wiring line change, the states of the connection portions between the power source wiring lines in the device process change. By way of example, in a case where a contact hole of the upper layer for connecting the auxiliary power source wiring line formed in the second wiring layer and the auxiliary power source wiring line formed in the third wiring layer is located over a contact hole of the lower layer for connecting the cellular power source wiring line formed in the first wiring layer and the auxiliary power source wiring line formed in the second wiring layer, defects to be described below take place: Since a stepped part to be formed by the contact hole of the upper layer enlarges due to the addition of a stepped part formed by the contact hole of the lower layer, there often occurs an inferior conduction of the contact hole of the upper layer, lowering in the step coverage of the auxiliary power source wiring line which is formed of the third wiring layer at the part of the contact hole of the upper layer, and so on. When the step coverage lowers, the auxiliary power source wiring line formed of the third wiring layer becomes more susceptible to electromigration because of the contraction of its cross-sectional area and causes a failure in connection in the worst case. For these reasons, the auxiliary power source wiring lines cannot be automatically placed by the DA system in accordance with the current density.

An object of the present invention is to provide, in a semiconductor integrated circuit device adopting the master slice scheme, a technique capable of reducing the inferior conductions between power source wiring lines, failures to connect power source wiring lines, etc., thereby to enhance the electrical reliability of the circuit device.

Another object of the present invention is to provide, in a semiconductor integrated circuit device adopting the master slice scheme, a technique capable of contracting the area occupied by auxiliary power source wiring lines, thereby to enhance the packaging density of the constituent circuits of the circuit device.

Another object of the present invention is to provide a technique capable of accomplishing the aforementioned objects and also capable of automatically placing the auxiliary power source wiring lines and automatically connecting the power source wiring lines by the use of a DA system, thereby to shorten the period of time for the development of the semiconductor integrated circuit device adopting the master slice scheme.

The above and other objects and novel features of the present invention will become apparent from the description of this specification when read in conjunction with the accompanying drawings.

Typical aspects of performance of the present invention are briefly summarized as follows:

(1) In a semiconductor integrated circuit device adopting the master slice scheme and having a three-layer power source wiring structure wherein a first layer of power source wiring and a third layer of power source wiring are extended in a column direction, while a second layer of power source wiring is extended in a row direction; second contact holes for connecting second-layer power source wiring lines and third-layer power source wiring lines are arranged around first contact holes for connecting first-layer power source wiring lines and the second-layer power source wiring lines, in regions in which the first-layer power source wiring lines, the second-layer power source wiring lines and the third-layer power source wiring lines intersect.

(2) The second contact holes are not arranged in that region around the first contact holes within which the first contact holes shift in the extending direction of the second-layer power source wiring lines.

According to the above expedient (1), the first contact holes do not exist under the second contact holes, and the shapes of steps underlying a region in which the second contact holes are to be formed can be moderated, so that the inferior conductions of the second contact holes, failures to connect the third-layer power source wiring lines, etc. can be reduced to enhance the electrical reliability of the semiconductor integrated circuit device adopting the master slice scheme. As a result, a DA system can be used for automatically setting the arrangement numbers and the sizes of the power source wiring lines, especially the second-layer power source wiring lines and the third-layer power source wiring lines, in accordance with current densities, and for automatically placing the power source wiring lines designed to the optima. It is therefore possible to shorten the period of time for developing the semiconductor integrated circuit device adopting the master slice scheme.

Moreover, the second contact holes are arranged in the region of large area around the first contact holes, and the total area of the second contact holes can be made larger than that of the first contact holes, so that a power source voltage can be supplied from the third-layer power source wiring line to the first-layer power source wiring line through the second-layer power source wiring line gradually without concentrating current densities. As a result, a resistance can be lowered or the influence of electromigration can be reduced at the connection parts between the power source wiring lines. It is therefore possible to enhance the electrical reliability of the semiconductor integrated circuit device adopting the master slice scheme.

According to the above expedient (2), even in the presence of a discrepancy between the laying pitch of the first-layer power source wiring lines and that of the third-layer power source wiring lines in the region in which the power source wiring lines of the respective layers intersect, the arrangement positions of the first contact holes do not agree with those of the second contact holes. Therefore, the shapes of the steps underlying the region in which the second contact holes are to be formed can be moderated, and likewise to the effect of the expedient (1), the inferior conductions of the second contact holes, the failures to connect the third-layer power source wiring lines, etc. can be reduced to enhance the electrical reliability of the semiconductor integrated circuit device adopting the master slice scheme.

The construction of the present invention will be described below in conjunction with the embodiments in which the present invention is applied to a semiconductor integrated circuit device adopting the master slice scheme as includes a sea-of-gates array.

Throughout the drawings for describing the embodiments, the same symbols shall be assigned to portions having identical functions and shall not be repeatedly explained.

Incidentally, the sea-of-gates array is stated in, for example, ISSCC DIGEST OF TECHNICAL PAPERS, February 1988, pp. 72-73.

BRIEF DESCRIPTION OF THE DRAWINGS

FIGS. 5A through 5C are enlarged plan views each showing the essential portions of the connected parts of the power source wiring lines of the semiconductor integrated circuit device;

FIG. 6 is a sectional view taken along cutting-plane line VI—VI in FIG. 5C;

DESCRIPTION OF THE PREFERRED EMBODIMENTS

Figure 1:
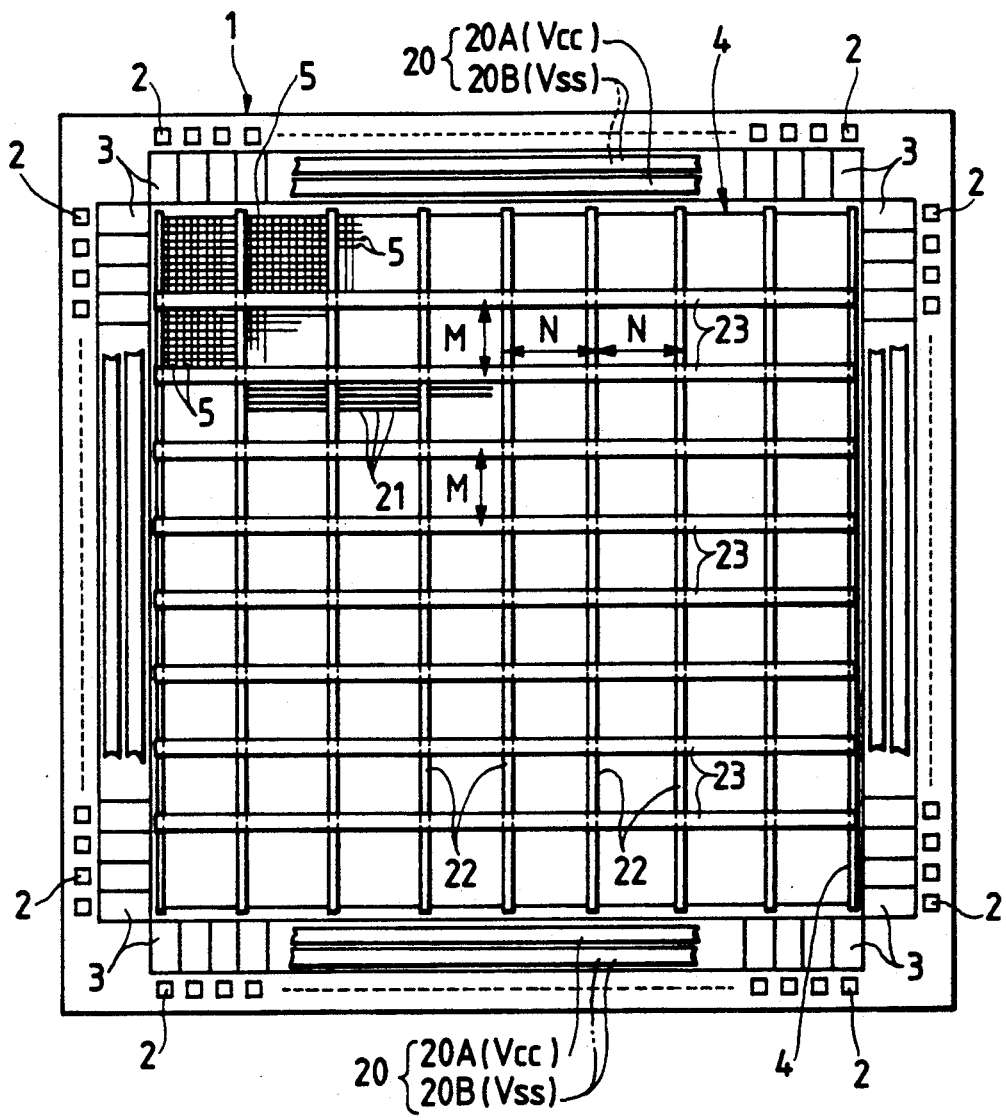
FIG. 1 is a plan view showing the fundamental schematic construction of a semiconductor integrated circuit device adopting the master slice scheme and conforming to a sea-of-gates organization, which is an embodiment of the present invention.

FIG. 1 (a plan view) shows the fundamental schematic construction of a semiconductor integrated circuit device adopting the master slice scheme and conforming to the sea-of-gates organization, which is an embodiment of the present invention.

As shown in FIG. 1, the semiconductor integrated circuit device 1 adopting the master slice scheme is constructed of a chip (for example, single-crystal silicon substrate) which is square in plan. The semiconductor integrated circuit device 1 has a plurality of external terminals (bonding pads) 2 and input/output buffer circuits 3 arranged on the peripheral part thereof extending along the respective latera of the square shape thereof.

The semiconductor integrated circuit device 1 of this embodiment adopting the ;master slice scheme is constructed of a three-layer wiring structure. Accordingly, the external terminals 2 are formed of the uppermost one of the wiring layers and by the manufacturing step of forming the third (and second) wiring layers. Each wiring layer of the three-layer wiring structure is made of aluminum wiring lines or aluminum alloy wiring lines. The aluminum alloy wiring lines are such that Al (aluminum) is doped with Cu (copper) or with Cu and Si (silicon). The dopant Cu chiefly functions to mitigate the influence of electromigration. On the other hand, the dopant Si chiefly functions to mitigate the phenomenon of alloy spikes.

Each of the input/output buffer circuits 3 is located inside the external terminals 2 so as to correspond to one or more of these external terminals 2. Although not shown in detail, the input/output buffer circuit 3 is constructed of a cell for an input buffer circuit and a cell for an output buffer circuit. The cell for the input buffer circuit is configured of, for example, complementary MISFETs (Metal-Insulator-Semiconductor field effect transistors), and it is connected as the input buffer circuit by the wiring lines which are mainly formed by the step of forming the first wiring layer. In addition, a clamping MISFET and a protective resistor capable of constructing an electrostatic breakdown preventing circuit are arranged for the cell for the input buffer circuit. The cell for the output buffer circuit is configured of complementary MISFETs (and bipolar transistors), and it is connected as the output buffer circuit by the wiring lines which are formed by the step of forming the first wiring layer.

Main power source wiring lines 20 are extended on the input/output buffer circuits 3. The main power source wiring lines 20 are placed over substantially the whole region of the input/output buffer circuits 3, and they are in the shape of rings when viewed in plan. The main power source wiring lines 20 consist of a power source voltage wiring line ($V_{cc}$) 20A and a reference voltage wiring line ($V_{ss}$) 20B.

The power source voltage wiring line 20A is supplied with, for example, the operating voltage 5 [V] of circuitry. The power source voltage wiring line 20A is formed by the step of forming the second wiring layer.

The reference voltage wiring line 20B is supplied with, for example, the ground potential 0 [V] of the circuitry. By way of example, the reference voltage wiring line 20B is formed by the steps of forming the second and third wiring layers and is constructed of a two-layer power source wiring structure. The line 20B is laid outside and along the power source voltage wiring line 20A in parallel therewith.

A basic cell array 4 for forming logic circuits is disposed at the central part of the semiconductor integrated circuit device 1 and within a region surrounded with the input/output buffer circuits 3. A multiplicity of basic cells 5 are arranged in a matrix shape in the basic cell array 4. Unlike those of a fixed channel organization, the basic cells 5 are densely arrayed in the matrix shape (are spread all over) without the intervention of any wiring forming region (any wiring channel region).

Figure 2:
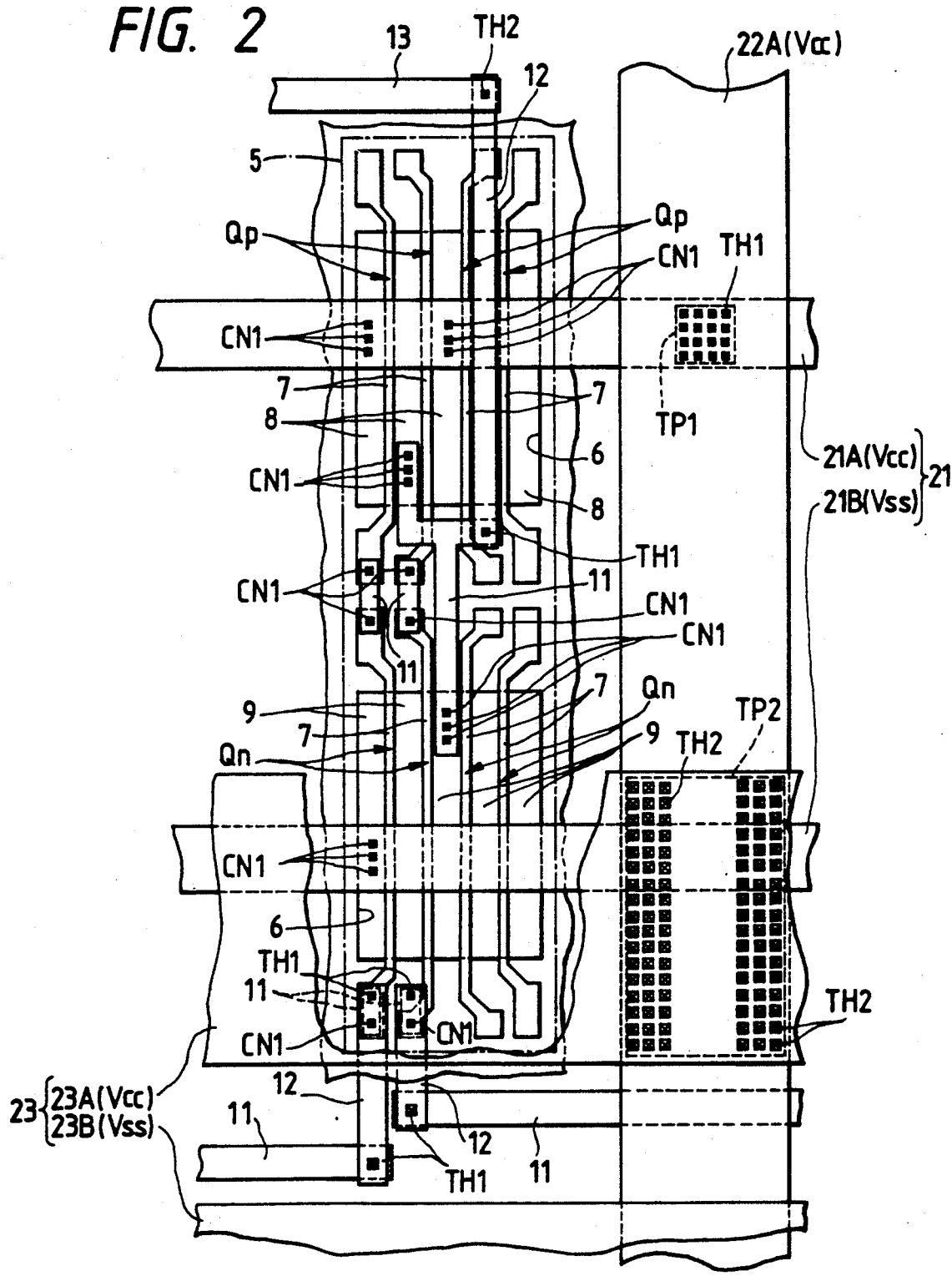
FIG. 2 is a plan view of the essential portions of one of basic cells which are arrayed in the semiconductor integrated circuit device.

As shown in FIG. 2 (a plan view of essential portions), the basic cell 5 is constructed of four pairs of complementary MISFETs. That is, it is constructed of four p-channel MISFETs $Q_p$ and four n-channel MISFETs $Q_n$. The p-channel MISFETs $Q_p$ are formed on the principal surface of an n-type well region within a region whose periphery is defined by a field insulator film 6. The p-channel MISFET $Q_p$ is mainly configured of a gate insulator film, a gate electrode 7, and a pair of $p^+$-type semiconductor regions 8 which are a source region and a drain region. The n-channel MISFETs $Q_n$ are formed on the principal surface of a p-type well region within a region whose periphery is defined by a field insulator film 6. The n-channel MISFET $Q_n$ is mainly configured of a gate insulator film, a gate electrode 7, and a pair of n+-type semiconductor regions 9 which are a source region and a drain region One p+-type semiconductor region 8 of any of the p-channel MISFETs $Q_p$ is constructed to be unitary with the other p+-type semiconductor region 8 of the other p-channel MISFET $Q_p$ which adjoins the first-mentioned MISFET $Q_p$ in the direction of a gate length. That is, the four p-channel MISFETs $Q_p$ are connected in series with one another without the intervention of the field insulator film 6. Likewise, one n+-type semiconductor region 9 of any of the n-channel MISFETs $Q_n$ is constructed to be unitary with the other n+-type semiconductor region 9 of the other n-channel MISFET $Q_n$ which adjoins the first-mentioned MISFET $Q_n$ in the direction of a gate length. That is, the four n-channel MISFETs $Q_n$ are connected in series with one another. The basic cell 5 is constructed so as to be easy of forming a 4-input NAND gate circuit. However, the basic cell 5 is not restricted to the 4-input NAND gate circuit, but it may well be easy of forming a 2-input NAND gate circuit or a 3-input NAND gate circuit.

Incidentally, the gate electrode 7 is formed of a polycide structure by way of example.

The elements in the basic cell 5 are connected by signal wiring lines 11 which are chiefly formed by the step of forming the first wiring layer. The basic cell 5 subjected to the connections constructs a predetermined logic circuit such as the NAND gate circuit or an F/F (flip-flop) circuit, or a part thereof.

The basic cells 5, or the logic circuits formed of the basic cells 5 are connected by signal wiring lines which are formed by the respective steps of forming the first, second and third wiring layers. The signal wiring lines 11 which are formed by the step of forming the first wiring layer, are arranged on the basic cells 5 not used as the logic circuits (not constituting the logic circuits) and are extended in the column direction of the semiconductor device 1. The signal wiring lines 12 which are formed by the step of forming the second wiring layer, are extended in the row direction of the semiconductor device 1. The signal wiring lines 13 which are formed by the step of forming the third wiring layer, are extended in the column direction identical to that of the wiring lines formed by the step of forming the first wiring layer. The widthwise dimension of each of the signal wiring lines which are formed by the respective steps of forming the first, second and third wiring layers, is set at about 2–4 [μm] in the semiconductor integrated circuit device 1 of this embodiment. The film thickness of each of the signal wiring lines which are formed by the respective steps of forming the first and second wiring layers, is set at 400–600 [nm] by way of example in order to chiefly arrange the signal wiring lines and to heighten the processing accuracy of the signal wiring lines. The film thickness of each of the wiring lines which are formed by the step of forming the third wiring layer, is set at 600–1000 [nm] by way of example in order to chiefly arrange the power source wiring lines and to lower the electric current densities of these power source wiring lines. The signal wiring lines of the respective layers are extended on regions corresponding to wiring regions (X-Y latticed wiring forming regions) which are indicated on the display of a DA system (an automatic placement and routing system) employing a computer.

The signal wiring lines 11 formed by the step of forming the first wiring layer and the signal wiring lines 12 formed by the step of forming the second wiring layer are electrically insulated by an inter-layer insulator film 31 (not shown) interposed therebetween, and are electrically connected through contact holes TH1. Likewise, the signal wiring lines 12 formed by the step of forming the second wiring layer and the signal wiring lines 13 formed by the step of forming the third wiring layer are electrically insulated by an inter-layer insulator film 32 (not shown) interposed therebetween, and they are electrically connected through contact holes TH2.

The elements in the basic cell 5 and the signal wiring lines 11 formed by the step of forming the first wiring layer are electrically insulated by an inter-layer insulator film 30 (not shown) interposed therebetween and are electrically connected through contact holes CN1.

The details of the contact holes TH1, TH2 and CN1 will be described in this disclosure later.

The inter-layer insulator films 31 and 32 are formed by, for example, the SOG (Spin on Glass) process so as to have their surfaces flattened.

In addition, these inter-layer insulator films 31 and 32 may well be made of silicon oxide films which are formed by CVD (Chemical Vapor Deposition) employing TEOS (tetraethyloxysilane) and whose surfaces are flattened.

Further, the inter-layer insulator film 30 is made of, for example, a BPSG (Boron-doped Phospho-Silicate Glass) film or a PSG (Phospho-Silicate Glass) film so as to have its surface flattened.

Figure 3:
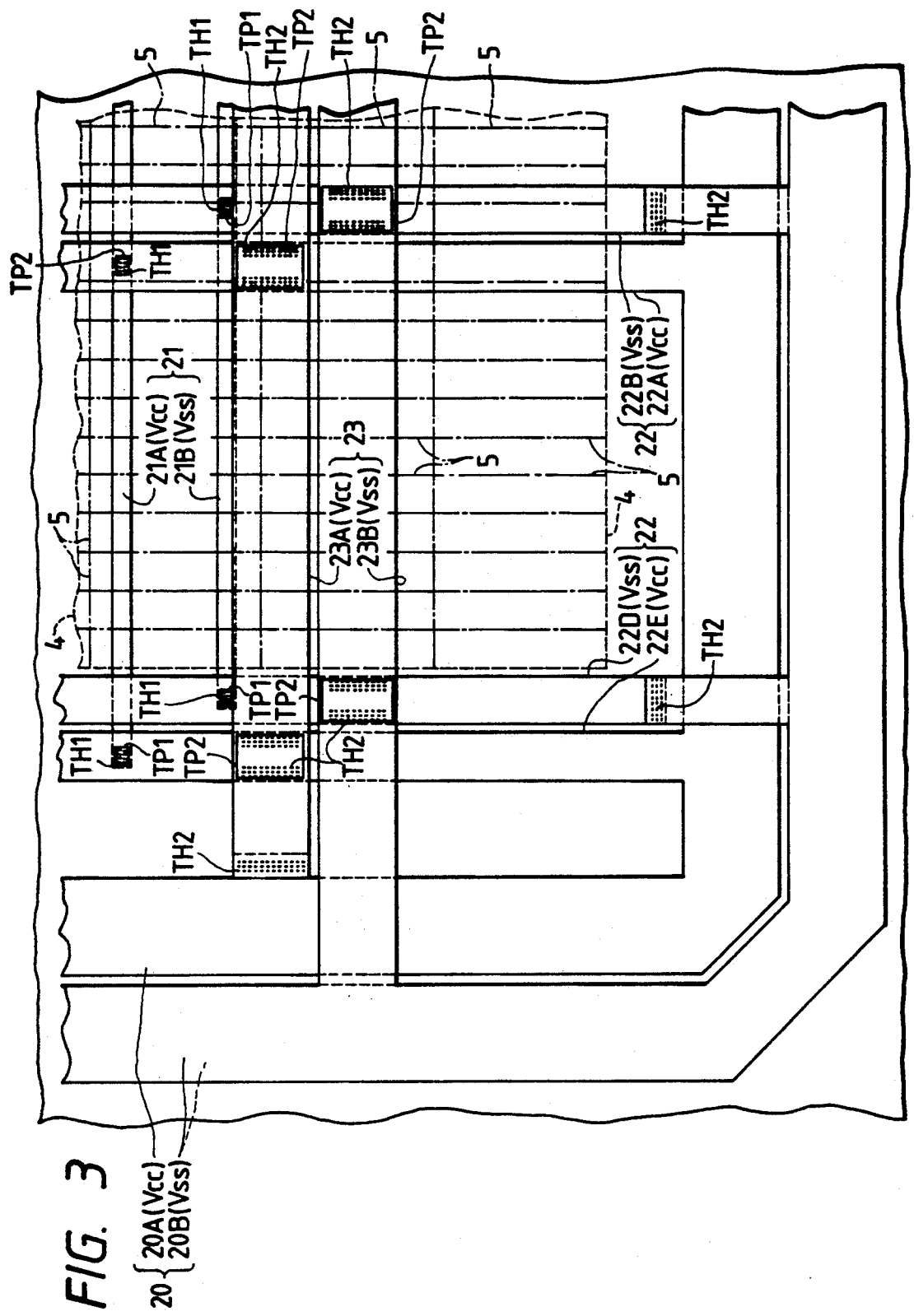
FIG. 3 is an enlarged plan view of the essential portions of the peripheral part of the semiconductor integrated circuit device.

As shown in FIG. 1, FIG. 2 and FIG. 3 (an enlarged plan view of essential portions), cellular power source wiring lines 21 are laid on the basic cells 5. The power source wiring lines 21 are formed by the step of forming the first wiring layer, and are extended in the column direction (X direction). These cellular power source wiring lines 21 consist of a cellular power source voltage wiring line ($V_{cc}$) 21A and a reference voltage wiring line ($V_{ss}$) 21B. The cellular power source voltage wiring line 21A is extended on the p-channel MISFETs $Q_p$ of the basic cells 5 in order to be connected to these p-channel MISFETs $Q_p$ with the minimum connection length. Likewise, the reference voltage wiring line 21B is extended on the n-channel MISFETs $Q_n$ of the basic cells 5 in order to be connected to these n-channel MISFETs $Q_n$ with the minimum connection length. The power source voltage wiring line 21A and the reference voltage wiring line 21B are spaced a predetermined interval from each other and are extended substantially in parallel with each other.

The cellular power source wiring lines 21 are extended in the column direction on the basic cell array 4, and are connected to auxiliary power source wiring lines 22 outside the end parts of the basic cell array 4 and on the basic cell array 4. The auxiliary power source wiring lines 22 are formed by the step of forming the second wiring layer, and are extended in the row direction (Y direction). Likewise to the main power source wiring lines 20 and the cellular power source wiring lines 21, the auxiliary power source wiring lines 22 on the basic cell array 4 are laid with an auxiliary power source voltage wiring line ($V_{cc}$) 22A and an auxiliary reference voltage wiring line ($V_{ss}$) 22B paired. The auxiliary power source wiring lines 22 extending in the row direction between the basic cell array 4 and the input/output buffer circuits 3 are laid with an auxiliary power source voltage wiring line ($V_{cc}$) 22C and an auxiliary reference voltage wiring line ($V_{ss}$) 22D paired. The cellular power source voltage wiring line 21A of the cellular power source wiring lines 21 and the auxiliary power source voltage wiring lines 22A, 22C of the auxiliary power source wiring lines 22 are electrically connected with each other through the contact holes TH1 which are provided in the inter-layer insulator film 31 (not shown) interposed between both the power source voltage wiring lines. Likewise, the reference voltage wiring line 21B and the auxiliary reference voltage wiring lines 22B, 22D are electrically connected with each other through the contact holes TH1.

In addition, the cellular power source wiring lines 21 and the elements in the basic cell 5 are electrically isolated by the inter-layer insulator film 30 (not shown) interposed therebetween and are electrically connected through the contact holes CN1.

At the end parts thereof in the extending directions, the auxiliary power source voltage wiring lines 22A and 22C of the auxiliary power source wiring lines 22 are directly connected to the power source voltage wiring line (the second layer) 20A of the main power source wiring lines 20 extending on the input/output buffer circuits 3. That is, the power source voltage wiring line 20A and the auxiliary power source wiring lines 22A and 22C are integrally formed. At the end parts thereof in the extending directions, the auxiliary reference voltage wiring lines 22B, 22D of the auxiliary power source wiring lines 22 are connected to the reference voltage wiring line (the third layer) 20B of the main power source wiring lines 20. The auxiliary reference voltage wiring lines 22B, 22D and the reference voltage wiring line 20B are electrically connected to each other through the contact holes TH2 which are provided in the inter-layer insulator film 32 (not shown) interposed between both the reference voltage wiring lines.

At predetermined intervals in the extending directions thereof, the auxiliary power source wiring lines 22 are connected to auxiliary power source wiring lines 23 which are extended in the column direction on the basic cell array 4. The auxiliary power source wiring lines 23 are formed by the step of forming the third wiring layer. Likewise to the cellular power source wiring lines 21 and the auxiliary power source wiring lines 22, the auxiliary power source wiring lines 23 are extended with an auxiliary power source voltage wiring line ($V_{cc}$) 23A and an auxiliary reference voltage wiring line ($V_{ss}$) 23B paired. The auxiliary power source voltage wiring lines 22A, 22C of the auxiliary power source wiring lines 22 and the auxiliary power source voltage wiring line 23A of the auxiliary power source wiring lines 23 are electrically connected to each other through the contact holes TH2 which are provided in the inter-layer insulator film 32 (not shown) interposed between both the auxiliary power source voltage wiring lines. Likewise, the auxiliary reference voltage wiring lines 22B, 22D and the auxiliary reference voltage wiring line 23B are electrically connected to each other through the contact holes TH2.

At the end part thereof in the extending direction, the auxiliary power source voltage wiring line 23A of the auxiliary power source wiring lines 23 is connected to the power source voltage wiring line (the second layer) 20A of the main power source wiring lines 20 extending on the input/output buffer circuits 3. The auxiliary power source voltage wiring line 23A and the power source voltage wiring line 20A are electrically connected to each other through the contact holes TH2 which are provided in the inter-layer insulator film 32 (not shown) interposed between both the power source voltage wiring lines. At the end part thereof in the extending direction, the auxiliary reference voltage wiring line 23B of the auxiliary power source wiring lines 23 is directly connected to the reference voltage wiring line (the third layer) 20B of the main power source wiring lines 20. That is, the reference voltage wiring line 20B and the auxiliary reference voltage wiring line 23B are integrally formed.

The auxiliary power source wiring lines 22C, 22D are connected to the main power source wiring lines 20 extending on the input/output buffer circuits 3, while independently of the connections, they are connected to the cellular power source wiring lines 21 extending on the basic cell array 4. The size of each input/output buffer circuit 3 is usually larger in comparison with that of each basic cell 5, so the arrayal interval of the input/output buffer circuits 3 and that of the basic cells 5 do not agree. The connection patterns of the input buffer circuit cells or output buffer circuit cells of the input/output buffer circuits 3, and the connection patterns between the input/output buffer circuits 3 and the basic cells 5 are formed by the step of forming the first wiring layer. In the absence of the auxiliary power source wiring lines 22 (22C and 22D), therefore, the connections between the main power source wiring lines 20 and the cellular power source wiring lines 21 are essentially limited to being within the interspaces between the adjacent input/output buffer circuits 3. In addition, the individual basic cells 5 of the basic cell array 4 are set either as the logic circuit forming regions or as the wiring regions (wiring channel regions) of the connection patterns formed by the step of the first wiring layer, depending upon the logic items to be included in the semiconductor integrated circuit device 1. Therefore, positions where the cellular power source wiring lines 21 are arranged differ depending upon the logic items. In these regards, the auxiliary power source wiring lines 22 (especially, 22C and 22D) can heighten the versatility of the connections between the main power source wiring lines 20 and the cellular power source wiring lines 21 and can enhance the packing density of the logic circuits. Moreover, as will be described later, the auxiliary power source wring lines 22 and 23 are constructed in layouts which are automatically connected by the DA system.

As shown in FIG. 1, the auxiliary power source wiring lines 22 in a plural number are arranged at substantially equal intervals (equal wiring pitches, or equal intervals of the center lines of the wiring lines) N in the column direction. The individual auxiliary power source wiring lines 22 arranged in the plural number are formed so as to have substantially the same widthwise dimension. The auxiliary power source wiring lines 22 feed the supply voltages to the cellular power source wiring lines 21 extending on the basic cell array 4, thereby to reinforce the supply cellular power source wiring lines 21 intersect the plurality of auxiliary power source wiring lines 22, in the extending direction thereof, and they are fed with the supply voltages from the auxiliary power source wiring lines 22 every intersection. That is, the auxiliary power source wiring lines 22 feed the supply voltages at the predetermined intervals (intervals N) in the extending direction of the cellular power source lines 21.

The auxiliary power source wiring lines 23 in a plural number are arranged at substantially equal intervals M in the row direction. The individual auxiliary power source wiring lines 23 arranged in the plural number are formed so as to have substantially the same widthwise dimension. The auxiliary power source wiring lines 23 feed the supply voltages to the auxiliary power source wiring lines 22, thereby to reinforce the supply voltages. The auxiliary power source wiring lines 22 intersect the plurality of auxiliary power source wiring lines 23, in the extending direction thereof, and they are fed with the supply voltages from the auxiliary power source wiring lines 23 every intersection. That is, the auxiliary power source wiring lines 23 feed the supply voltages at the predetermined intervals (intervals M) in the extending direction of the auxiliary power source wiring lines 22.

In this manner, the semiconductor integrated circuit device 1 is adapted to feed the supply voltages from the main power source wiring lines (the second and third layers) 20 extending on the input/output buffer circuits 3, to the basic cells 5 through all of the auxiliary power source wiring lines (the third layer) 23, the auxiliary power source wiring lines (the second layer) 22 and the cellular power source wiring lines (the first layer) 21. That is, the semiconductor integrated circuit device 1 can uniformly feed the supply voltages to the basic cell array 4 by means of the auxiliary power source wiring lines 22 and 23 extending in a lattice shape on the basic cell array 4. As stated before, the supply voltages are dispersed (or branched). successively from the auxiliary power source wiring lines 23 of the upper layer to the power source wiring lines 21 of the lower layer through the auxiliary power source wiring lines 22, so that the widthwise dimensions of the wiring lines are enlarged successively from the power source wiring lines 21 of the lower layer toward the auxiliary power source wiring lines 23 of the upper layer. By way of example, the power source wiring lines 21 of the lower layer are formed at a widthwise dimension of about 6-10 [$\mu$m]. The auxiliary power source wiring lines 22 are formed at a widthwise dimension of about 15-25 [$\mu$m]. The auxiliary power source wiring lines 23 of the upper layer are formed at a widthwise dimension of about 30-50 [$\mu$m].

Figure 4:
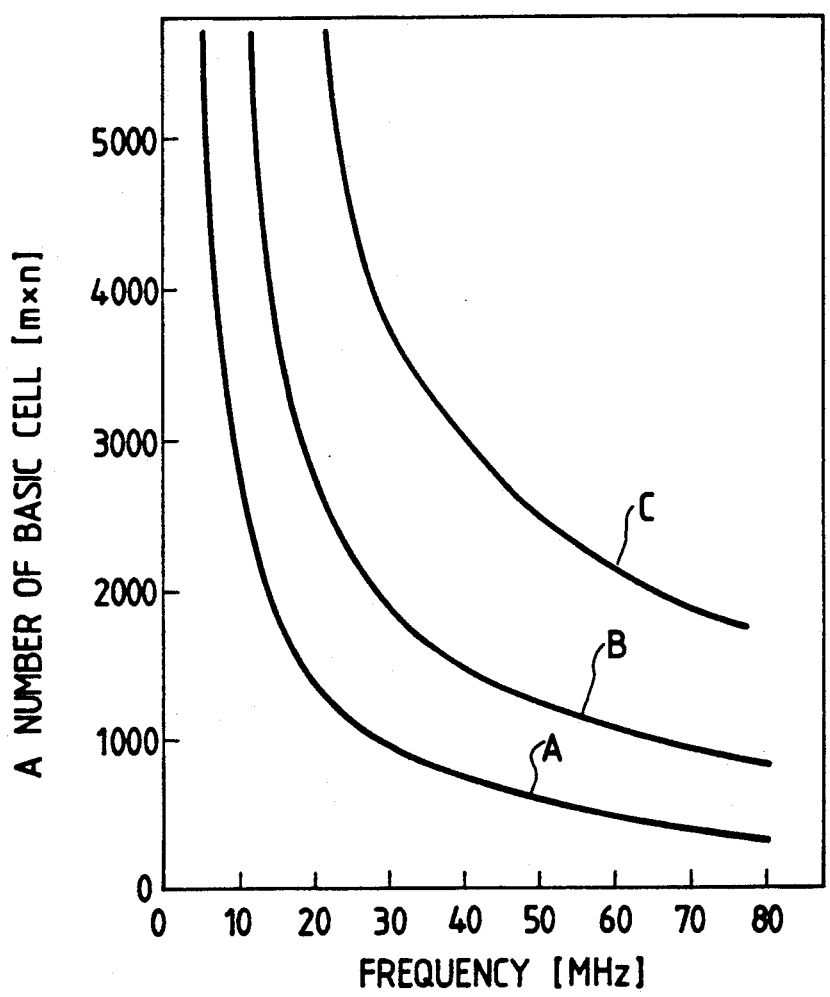
FIG. 4 is a graph showing the relationships among the number of the basic cells of the semiconductor integrated circuit device, and the frequency and the current density which are used.

The interval M and arrangement number of the auxiliary power source wiring lines 23 extending in the column direction, and the interval N and arrangement number of the auxiliary power source wiring lines 22 extending in the row direction have a frequency to-be-used and wiring line sizes as their respective major conditions and are stipulated on the basis of the number of the basic cells 5. FIG. 4 (an elucidative graph) shows the relationships between the frequency and the number of basic cells in an example. In FIG. 4, the axis of abscissas represents the frequency [in MHz]. The axis of ordinates represents the number of the basic cells 5 (the product between the number m of the basic cells 5 arrayed in the row direction and the number n of the basic cells 5 arrayed in the column direction). Each of curves A, B and C indicates the total cross-sectional area [in $\mu$m$^2$] of the auxiliary power source wiring lines obtained by adding the cross-sectional area of the single auxiliary power source wiring line 23 to that of the single auxiliary power source wiring line 22. The curve A corresponds to a case where the total cross-sectional area of the auxiliary power source wiring lines is, for example, 22-23 [$\mu$m$^2$]. The curve B corresponds to a case where the total cross-sectional area of the auxiliary power source wiring lines is, for example, 35-36 [$\mu$m$^2$]. The curve C corresponds to a case where the total cross-sectional area of the auxiliary power source wiring lines is, for example, 61-62 [$\mu$m$^2$]. Since a electric current density most suited to the single basic cell 5 can be measured, the number of the basic cells 5 and the total cross-sectional area of the auxiliary power source wiring lines required for the basic cells 5 in that number can be found from the graph of FIG. 4 in accordance with the service frequency.

By way of example, in a case where the service frequency is 30 [MHz]and where the total cross-sectional area of the auxiliary power source wiring lines is 22-23 [$\mu$m$^2$] (the curve A), the number of the basic cells 5 for establishing the optimum electric current density is about 1000. This number of the basic cells 5 is the product between the number m of the basic cells 5 arranged in the row direction and the number n of the basic cells 5 arranged in the column direction. By way of example, therefore, one auxiliary power source wiring line 23 is extended every ten basic cells 5 arrayed in the row direction, while one auxiliary power source wiring line 22 is extended every hundred basic cells 5 arrayed in the column direction. The semiconductor integrated circuit device 1 adopting the master slice scheme, under development by the inventor, is such that one auxiliary power source wiring line 23 is extended every about ten-twenty basic cells 5 arrayed in the row direction, while one auxiliary power source wiring line 22 is extended every about one hundred-two hundred basic cells 5 arrayed in the column direction.

Thus, the number of the basic cells 5 which are arrayed within a division demarcated by and surrounded with the auxiliary power source wiring lines 22 extending in the row direction and the auxiliary power source wiring lines 23 extending in the column direction becomes substantially equal to the number of the basic cells 5 which are arrayed in another demarcated division. Besides, electric current densities in the individual divisions become substantially equal. Accordingly, each divisional region demarcated by the auxiliary power source wiring lines 22 and 23 has the electric current density set to the optimum on the basis of the number of the basic cells 5, so that any extreme concentration of electric currents does not occur whatever logic circuits may be arranged in the region. Incidentally, the utilization ratio of the basic cells 5 (the arrangement rate of the logic circuits) within the divisional region need not always be 100 [%], but an allowable range is usually possessed to the extent of 20 [%]. Therefore, the utilization factor is about 80 [%]on the average.

In this manner, in the semiconductor integrated circuit device 1 adopting the master slice scheme, the basic cell array 4 is furnished with the plurality of auxiliary power source wiring lines 23 which are extended in the column direction and which are arranged substantially at the equal intervals M in the row direction, and the plurality of auxiliary power source wiring lines 22 which are extended in the column direction and which are arranged substantially at the equal intervals N in the column direction (the ratio between the arrangement of the auxiliary power source wiring lines 23 and that of the auxiliary power source wiring lines 22 is set at M : N). This construction makes it possible to substantially equalize the numbers of the basic cells 5 in the respective divisional regions demarcated by the auxiliary power source wiring lines 23 and the auxiliary power source wiring lines 22, and to substantially equalize the electric current densities in the divisional regions. Therefore, the numbers and sizes of the auxiliary power source wiring lines 23 and the auxiliary power source wiring lines 22 are optimized according to the electric current densities in the respective divisional regions, to contract the occupation areas of the auxiliary power source wiring lines 22 and 23 being wasteful, whereby the packaging rate of the logic circuits in the semiconductor integrated circuit device 1 adopting the master slice scheme can be enhanced.

The practicable structures of the connection portion between the power source wiring line 21 and the auxiliary power source wiring line 22 and the connection portion between the auxiliary power source wiring line 22 and the auxiliary power source wiring line 23 will be described with reference to FIG. 2, FIG. 3, FIGS. 5A thru 5C (enlarged plan views of essential portions), and FIG. 6 (a sectional view taken along cutting-plane line VI—VI in FIG. 5C).

The structure of the connection portion between the power source voltage wiring line ($V_{cc}$) 21A and the auxiliary power source voltage wiring line ($V_{cc}$) 22A is fundamentally the same as that of the connection portion between the reference voltage wiring line ($V_{ss}$) 21B and the auxiliary reference voltage wiring line ($V_{ss}$) 22B. In addition, the structure of the connection portion between the auxiliary power source voltage wiring line ($V_{cc}$) 22A and the auxiliary power source voltage wiring line ($V_{cc}$) 23A is substantially the same as that of the connection portion between the auxiliary reference voltage wiring line ($V_{ss}$) 22B and the auxiliary reference voltage wiring line ($V_{ss}$) 23B. In the ensuing description, therefore, only the structures of the connection portion between the power source voltage wiring line ($V_{cc}$) 21A and the auxiliary power source voltage wiring line ($V_{cc}$) 22A and the connection portion between the auxiliary power source voltage wiring line ($V_{cc}$) 22A and the auxiliary power source voltage wiring line ($V_{cc}$) 23A shall be concretely explained.

Figure 5A:
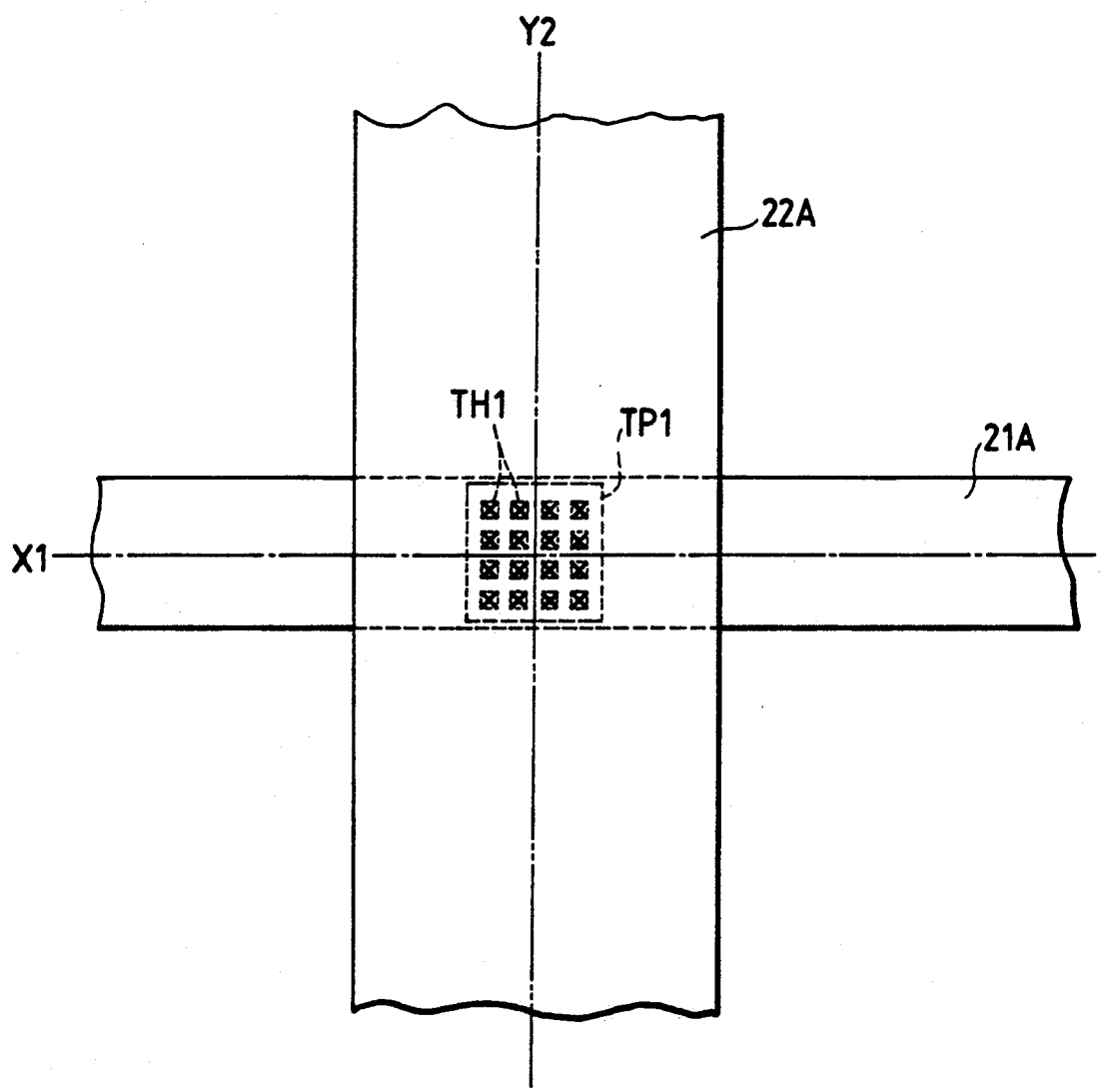

As shown in FIG. 5A and FIG. 6, the contact holes TH1 for connecting the power source voltage wiring line 21A (the first layer) and the auxiliary power source voltage wiring line 22A (the second layer) are provided in the inter-layer insulator film 31 at the intersection part between the center line X1 of the power source voltage wiring line 21A and the center line Y2 of the auxiliary power source voltage wiring line 22A. In order to lower the resistance of a supply voltage feeding path, the contact holes TH1 are densely arranged in a plural number, and the openings of the plurality of contact holes TH1 are made substantially the same size.

Since the semiconductor integrated circuit device 1 of this embodiment adopting the master 1 slice scheme employs a manufacturing process of 0.8 [μm], each of the contact holes TH1 is constructed with dimensions of, for example, 0.8×0.8 [μm²] though this opening size is not restrictive The contact holes TH1 are automatically formed in such a way that, in the DA system to be described later, a contact hole cell TP1 is placed under the condition under which its central position agrees with the intersection point (X-Y lattice point) between the center line X1 and the center line Y2. Although no restriction is meant, the contact holes TH1 in a number of 16 are arranged in the contact hole cell TP1. These contact holes TH1 are arranged in a matrix array within a region which is defined by a dimension in the column direction being not greater than ½ of the width in the column direction of the power source voltage wiring line 22A and a dimension in the row direction being substantially equal to the width in the row direction of the power source voltage wiring line 21A.

In addition, the contact holes TH1 arranged at the intersection part between the power source wiring line 21 and the auxiliary power source wiring line 22 are constructed with substantially the same opening size as that of the contact holes TH1 for connecting the wiring line formed by the step of forming the first wiring layer and the wiring line formed by the step of forming the second wiring layer By way of example, the contact holes TH1 for connecting the power source wiring lines 21 and 22 are constructed with the same opening size as that of the contact hole TH1 for connecting the signal wiring line 11 formed by the step of forming the first wiring layer and the signal wiring line 12 formed by the step of forming the second wiring layer as shown in FIG. 2. Thus, when these contact holes TH1 are formed by etching, the micro-loading effect is reduced, and etching conditions are made uniform, whereby the electrical reliabilities of the connection portions can be enhanced, and the available percentage in the manufacture of the circuit device can be heightened.

In brief, the contact holes TH1 are constructed in a layout causing no inferior conduction, irrespective of regions and conditions in and under which they are arranged, in relation to the fact that the arrangement positions of the power source wiring lines 21 and the auxiliary power source wiring lines 22 change depending upon the logic items included in the semiconductor integrated circuit device 1.

Figure 5B:
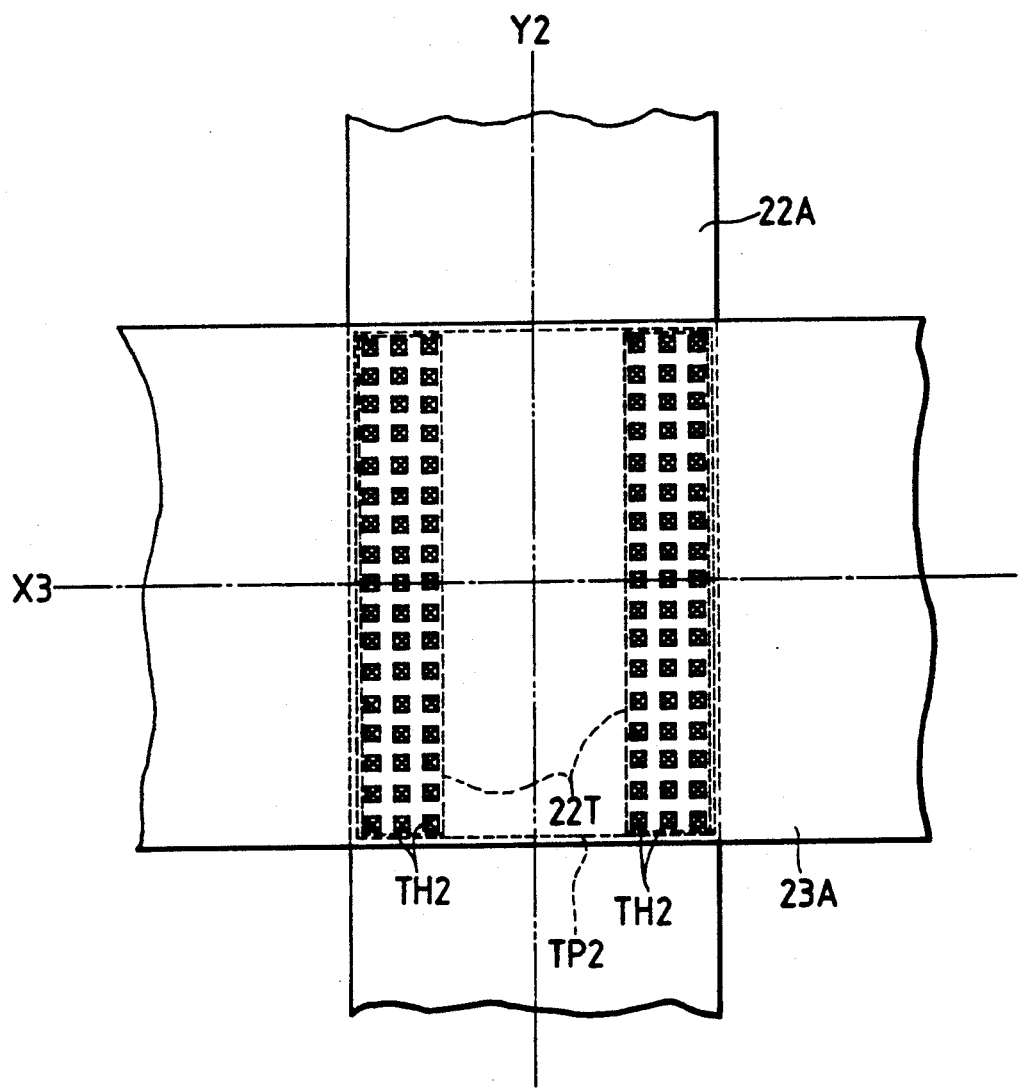

As shown in FIG. 5B and FIG. 6, the contact holes TH2 for connecting the auxiliary power source voltage wiring line 22A (the second layer) and the auxiliary power source voltage wiring line 23A (the third layer) are provided in the inter-layer insulator film 32 at the intersection part between the center line X3 of the latter line 23A and the center line Y2 of the former line 22A. Likewise to the case of the contact holes TH1, the contact holes TH2 are densely arranged in a plural number, and the openings of the plurality of contact holes TH2 are made substantially the same. Each of the contact holes TH2 is constructed with dimensions of, for example, 0.8×0.8 [μm²] similar to the contact hole TH1. The contact holes TH2 are formed in such a way that, in the DA system, a contact hole cell TP2 is placed under the condition under which its central position agrees with the intersection point (X-Y lattice point) between the center line X3 and the center line Y2. Although no restriction is intended, a plurality of the contact holes TH2 are shown arranged in the contact hole cell TP2.

As shown in FIG. 5C and FIG. 6, these contact holes TH2 are arranged in a region around the contact holes TH1. That is, the region where the contact holes TH2 are arranged is set at regions 22T different from the region where the contact holes TH1 are arranged (the arrangements of the contact holes TH1 and TH2 are not brought into correspondence).

More specifically, the contact holes TH2 are arranged in a matrix array within the regions 22T each of which is spaced from the center line Y2 in the row direction by, at least, ½ of the length in the column direction of the contact hole cell TP1, and each of which is defined by a dimension in the column direction being not greater than ½ of the half width in the column direction of the auxiliary power source voltage wiring line 22A and a dimension in the row direction being substantially equal to the width in the row direction of the auxiliary power source voltage wiring line 23A.

Further, the total area of the contact holes TH2 (the total area of the openings of these contact holes) is made larger as compared with the total area of the contact holes TH1. By way of example, in this embodiment, the single contact hole TH1 or TH2 is formed in the area of, for example, about 0.5–0.7 [$\mu m^2$] as mentioned before, so that the total area of the 16 contact holes TH1 arranged in the single contact hole cell TP1 is about 8.0–11.2 [$\mu m^2$], while the total area of the 102 contact holes TH2 arranged in the single contact hole cell TP2 arranged in the single contact hole cell TP2 is about 50.0–72.0 [$\mu m^2$].

In addition, the arrangement interval of the cellular power source wiring lines 21 and the arrangement interval (M) of the auxiliary power source wiring lines 23, both the wiring lines extending in the identical column direction, do not always agree for the reason that the former wiring line 21 is arranged every basic cell 5, whereas the latter wiring line 23 is arranged every predetermined number of basic cells 5. As shown in FIG. 5C and FIG. 6, therefore, the contact hole cell TP2 is constructed in a pattern in which the contact holes TH2 are arranged in the regions 22T lying around the contact hole cell TP1 and outside the two latera of this cell TP1 opposing in the extending direction of the power source voltage wiring line 21A (or the auxiliary power source voltage wiring line 23A), to prevent the contact holes TH1 and the contact holes TH2 from being located at the same positions in the case of connecting the power source voltage wiring line 21A and the auxiliary power source voltage wiring lines 22A and 23A in the region in which these power source wiring lines intersect. Thus, even when the contact holes TH1 shift in the extending direction of the auxiliary power source voltage wiring line 22A (in senses indicated by a two-headed arrow y on the center line Y2) relative to the contact holes TH2, the contact holes TH2 within the contact hole cell TP2 do not lie in the region into which the contact holes TH1 shift.

Moreover, each of the contact holes TH2 arranged at the intersection part between the auxiliary power source wiring lines 22 and 23 is constructed with substantially the same size as that of each of the contact holes TH2 for connecting the signal wiring line 12 formed by the step of forming the second wiring layer and the signal wiring line 13 formed by the step of forming the third wiring layer. Thus, as in the case of the contact holes TH1, the available percentage in the manufacture can be heightened in the formation of the contact holes TH2.

Besides, each of the contact holes CN1 for connecting the elements within the basic cell 5 and the signal wiring line 11 or power source wiring line 21 formed by the step of forming the first wiring layer is constructed with substantially the same size as that of each of the contact holes TH1, TH2.

Numeral 30 indicated in FIG. 6 designates the interlayer insulator film which electrically insulates the basic cells 5 and the wiring lines formed by the step of forming the first wiring layer. Further, numeral 33 designates a final passivation film.

As thus far described, in a semiconductor integrated circuit device 1 adopting the master slice scheme in a three-layer power source wiring structure which has power source wiring lines 21 and auxiliary power source wiring lines 23 extended in a column direction and auxiliary power source wiring lines 22 extended in a row direction; contact holes TH2 for connecting the auxiliary power source wiring line 22 and the auxiliary power source wiring line 23 are arranged around contact holes TH1 for connecting the power source wiring line 21 and the auxiliary power source wiring line 22, in a region in which the power source wiring line 21, the auxiliary power source wiring line 22 and the auxiliary power source wiring line 23 intersect. Owing to this construction, the contact holes TH1 do not underlie the contact holes TH2, and the shapes of steps underlying a region in which the contact holes TH2 are formed can be moderated, so that the inferior conductions of the contact holes TH2, the failures of the auxiliary power source wiring lines 23 in connections, etc. can be reduced to enhance the electrical reliability of the semiconductor integrated circuit device 1 adopting the master slice scheme. As a result, a DA (design automation) system can be used for automatically setting the arrangement numbers and wiring line sizes of the power source wiring lines, especially the auxiliary power source wiring lines 22 and the auxiliary power source wiring lines 23, in accordance with current densities. This serves to enhance the electrical reliability of the semiconductor integrated circuit device 1 in which the auxiliary power source wiring lines 22 and 23 optically designed are automatically placed, and to automate the laying of the power source wiring lines at a high electrical reliability by means of the DA system. The result is that a term for the development of the semiconductor integrated circuit device 1 adopting the master slice scheme can be shortened.

In addition, the contact holes TH2 are arranged in a spacious region around the contact holes TH1, and the total area of the contact holes TH2 is made larger than that of the contact holes TH1, so that supply voltages can be fed from the auxiliary power source wiring lines 23 to the power source wiring lines 21 through the auxiliary power source wiring lines 22 gradually without the concentration of currents. As a result, it is possible to lower a resistance or mitigate the influence of electromigration in the contact hole part between the power source wiring lines of an upper layer and a lower layer, so that the electrical reliability of the semiconductor integrated circuit device 1 adopting, the master slice scheme can be enhanced.

Furthermore, the contact holes TH2 are not arranged in those regions around the contact holes TH1 into which the contact holes TH1 shift in the extending direction of the auxiliary power source wiring line 22. Owing to this construction, even in a case where a discrepancy exists between the laying interval of the power source wiring lines 21 and that of the auxiliary power source wiring lines 23 in the intersection region, the arrangement positions of the contact holes TH1 and those of the contact holes TH2 do not agree. Therefore, the shapes of the steps underlying the region in which the contact holes TH2 are formed can be moderated, and as in the foregoing, the inferior conductions of the contact holes TH2, the failures of the auxiliary power source wiring lines 23 in connections, etc. can be reduced, to enhance the electrical reliability of the semiconductor integrated circuit device 1 adopting the master slice scheme. As a result, in connecting the power source wiring line 21 and the auxiliary power source wiring line 22 and connecting the auxiliary power source wiring line 22 and the auxiliary power source wiring line 23 in the intersection region, the versatilities of these connections can be enhanced, and the auxiliary power source wiring lines 22 and 23 can be automatically placed (the automation of the laying of the power source wiring lines in the DA system is realized), so that the term for the development of the semiconductor integrated circuit device 1 adopting the master slice scheme can be shortened.

Further, the opening size of each of contact holes for connecting signal wiring lines 11 (or 12) formed by the same wiring forming step as that of the cellular power source wiring lines 21 (or the auxiliary power source wiring lines 22) and signal wiring lines 12 (or 13) formed by the same wiring forming step as that of the auxiliary power source wiring lines 22 (or 23) is substantially equalized to the opening size of each of the contact holes TH1 (or TH2). This construction makes it possible to enhance the electrical reliability of the parts of the connections and to heighten the available percentage of articles in manufacture.

Figure 7:
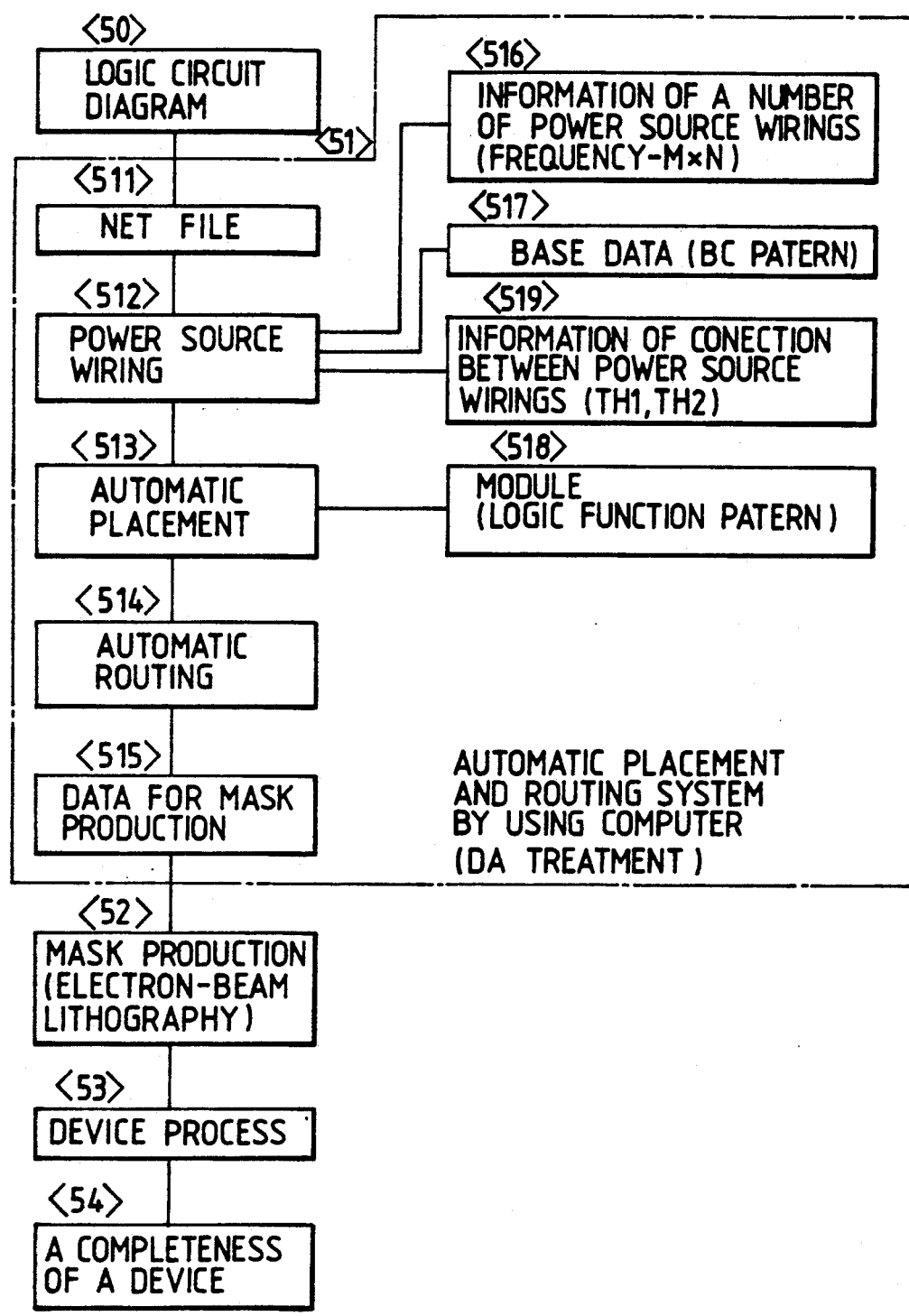
FIG. 7 is a process flow chart for explaining a method of forming the semiconductor integrated circuit device.

Now, a method of forming the above-stated semiconductor integrated circuit device 1 adopting the master slice scheme will be briefly described with reference to FIG. 7 (a process flow chart).

First, logic items to be included in the semiconductor integrated circuit device 1 are designed, and a logic circuit diagram is prepared <50>.

Subsequently, on the basis of the logic circuit diagram, logic circuits are automatically arranged and connected by the DA system employing a computer <51>. As the operations of the DA system, connection information items based on the logic circuit diagram and converted into a form (NET FILE) adapted to be handled by the DA system are initially input to this DA system <511>.

Next, power source wiring lines are automatically arranged <512> on a semiconductor integrated circuit device (base chip) which is stored in the base data <517> of the DA system and which is imaginarily expressed. The base data <517> is information in which basic cell patterns are arrayed on semiconductor integrated circuit devices (base chips). The power source wiring lines are auxiliary power source wiring lines (22 and 23), which are arranged on the basis of the information items <516> of the numbers of power source wiring lines. That is, as stated before, each of the auxiliary power source wiring lines 23 extending in a column direction is arranged every m-th basic cell, and each of the auxiliary power source wiring lines 22 extending in a row direction is arranged every n-th basic cell, chiefly on the basis of a service frequency to be used and the sizes of the wiring lines. In the automatic arrangements of the auxiliary power source wiring lines, the sizes and numbers of the wiring lines can be freely varied so that electric current densities in regions demarcated by the auxiliary power source wiring lines can be optimally controlled on the basis of the frequency and the wiring line sizes. The auxiliary power source wiring lines are arranged in only a basic cell array 4, and they are not arranged in the other region because this region is prohibited from arranging power source wiring lines. Among the power source wiring lines, main power source wiring lines 20 and cellular power source wiring lines 21 are stored as fixed patterns in the base data <517>.

Besides, at the step of automatically arranging the power source wiring lines, these power source wiring lines are connected on the basis of the information items <519> of the connection parts between power source wiring lines. As illustrated in FIGS. 5A thru 5C and FIG. 6, the connections between the power source wiring lines are done in such a manner that contact hole cells TP1 and TP2 are located with their central positions agreeing with the intersection points (X-Y lattice points) of the center lines of the respective power source wiring lines. Each of the contact hole cells TP1 and TP2 is fundamentally arranged at that connection part between the power source wiring lines of upper and lower layers whose position varies within the basic cell array 4. That is, each of the contact hole cells TP1 and TP2 is not arranged at the connection part between the power source wiring lines as is the fixed pattern.

Next, the designed logic circuits are automatically placed <513> on the basis of the connection information items input to the DA system. The automatic placement of the logic circuits is performed in such a way that modules (the connection patterns of logic circuits) <518> stored in the DA system are automatically arranged along the basic cell pattern.

Next, the logic circuits (modules) automatically placed are automatically connected by signal wiring lines on the basis of the connection information items, thereby to finish up logic circuit information items <514>.

At the next step, the logic circuit information items finished up by the DA system are converted into data for mask production on the basis of design rules in this DA system <515>. The above step <511> of inputting the connection information items, though this step <515> of converting the logic circuit information items into the data for mask production are automatically treated by the DA system.

Subsequently, on the basis of the data for mask production, a connecting mask (a manufacturing mask with the connection patterns) is formed <52> by an electron-beam (EB) projection aligner.

Subsequently, device processes are performed <53> using the connecting mask, whereby the semiconductor integrated circuit device 1 bearing the predetermined logic items is substantially completed <54>.

As thus far described, a method of forming a semiconductor integrated circuit device 1 adopting the master slice scheme and to be formed by a DA system comprises the step <512> of automatically arranging each of auxiliary power source wiring lines (22 and 23) every predetermined number of basic cells 5 on the basis of the wiring line number information <516> of the DA system, followed by the step <513> of automatically placing the connection patterns of logic circuits and the step <514> of automatically connecting the logic circuits by the use of signal wiring lines. Owing to this construction, the auxiliary power source wiring lines 22 and 23 are arranged beforehand so as to establish optimum electric current densities. This dispenses with the step of rearranging auxiliary power source wiring lines in accordance with the electric current densities of predetermined regions after the step of arranging the auxiliary power source wiring lines stored as fixed patterns in the base data of the DA system and then automatically connecting logic circuits. In correspondence with the rearrangement step, therefore, the treatment of the DA system is relieved, and a term for the development of the semiconductor integrated circuit device 1 adopting the master slice scheme can be shortened.

Figure 8:
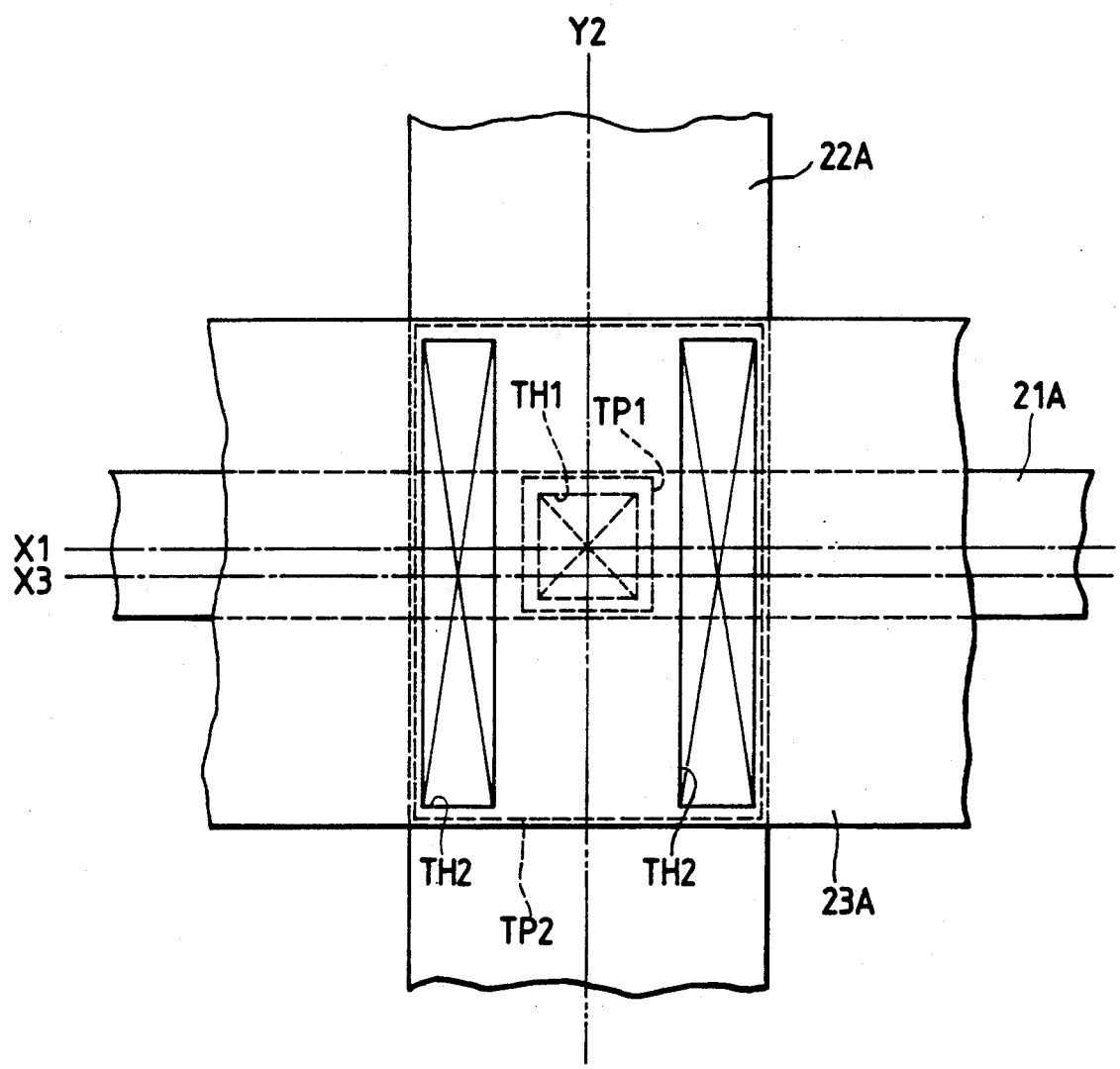
FIG. 8 is an enlarged plan view of the essential portions of the connected parts of power source wiring lines in another embodiment of the present invention.

Besides, the present invention may well be such that, as shown in FIG. 8 (an enlarged plan view of essential portions), a single contact, hole TH1 is provided for connecting a cellular power source voltage wiring line 21A and an auxiliary power source voltage wiring line 22A, while two contact holes TH2 are provided on both the sides of the contact hole TH1, for connecting the auxiliary power source voltage wiring line 22A and an auxiliary power source voltage wiring line 23A. Unlike the foregoing embodiment, each of the contact holes TH1 and TH2 thus constructed does not require isolation regions for the plurality of divided contact holes. Therefore, this embodiment can increase the total areas of the openings of the contact holes and render the resistances of supply voltage feeding paths still lower.

Figure 9:
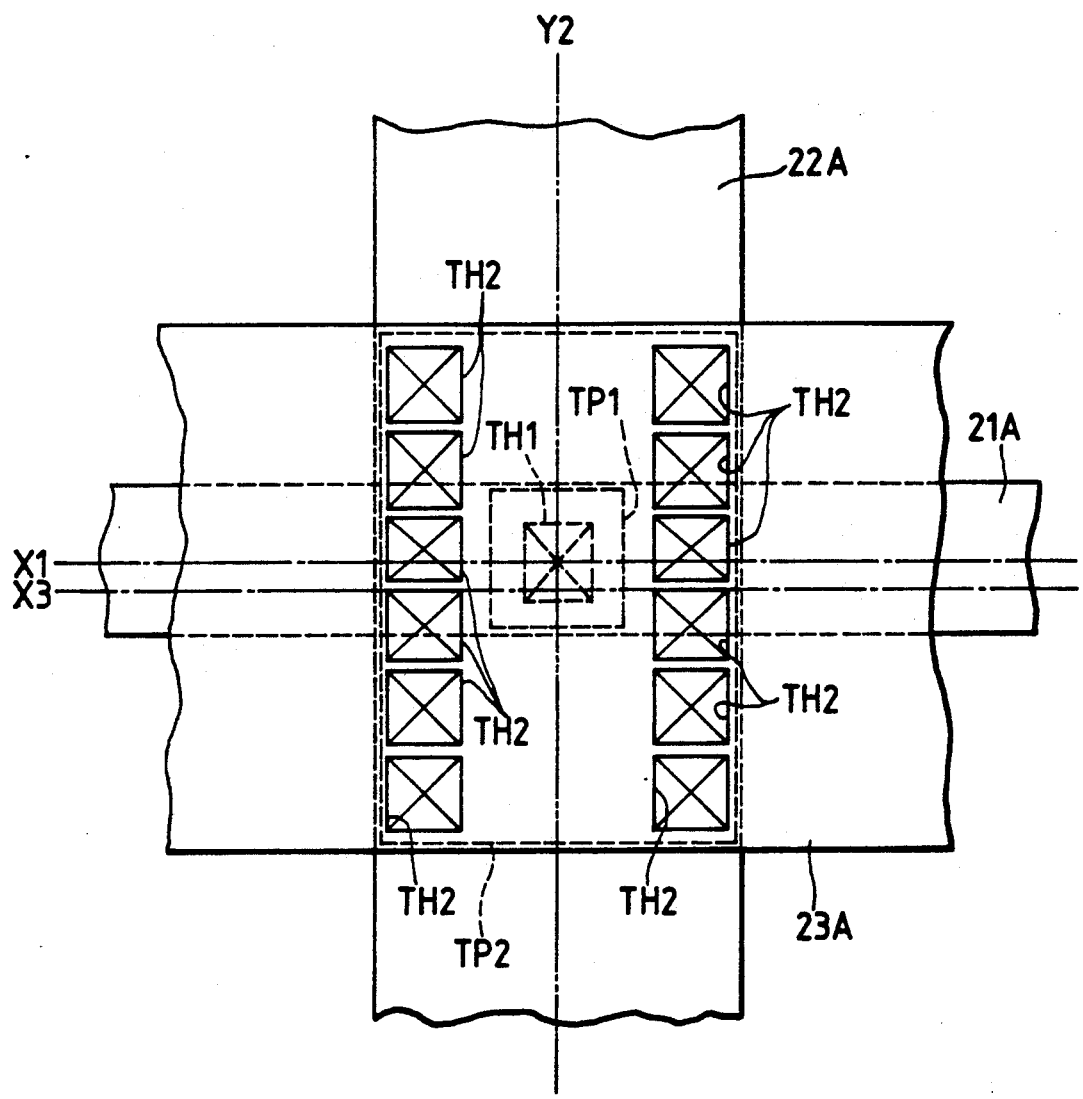
FIG. 9 is an enlarged plan view of the essential portions of the connected parts of power source wiring lines in still another embodiment of the present invention.

Further, the present invention may well be such that, as shown in FIG. 9 (an enlarged view of essential portions), a single contact hole TH1 is provided for connecting a power source voltage wiring line 21A and an auxiliary power source voltage wiring line 22A, while a plurality of contact holes TH2 for connecting the auxiliary power source voltage wiring line 22A and an auxiliary power source voltage wiring line 23A are provided on both the sides of the contact hole TH1, each of the contact holes TH2 having the same opening size as that of the contact hole TH1. The contact holes TH1 and TH2 thus constructed can lower the resistances of supply voltage feeding paths, and can enhance the electrical reliabilities of the connection portions.

Although, in the above, the invention made by the inventor has been concretely described in conjunction with embodiments, it is a matter of course that the present invention is not restricted to the foregoing embodiments, but that it can be variously altered within a scope not departing from the purport thereof.

By way of example, the present invention is also applicable to a sea-of-gates array in which a macro cell such as RAM (Random Access read/write Memory) or ROM (Read Only Memory) is built. Incidentally, the memory cells of the RAM, ROM or the like are usually formed in a two-layer metal wiring structure. Therefore, auxiliary power source wiring lines may be formed on only the parts of a basic cell array except memory cell regions, or only auxiliary power source wiring lines which are formed by the step of forming a third wiring layer may be extended on the memory cell regions.

Further, the present invention is applicable to a semiconductor integrated circuit device adopting the master slice scheme as has a power source wiring structure of four or more layers.

Still further, the present invention is applicable to a semiconductor integrated circuit device adopting the master slice scheme as conforms to a fixed channel organization wherein wiring channel regions are arranged between adjacent basic cell arrays.

Yet further, the present invention is applicable to a semiconductor integrated circuit device adopting the master slice scheme as has each basic cell constructed of bipolar transistors and complementary MISFETs.

Effects which are attained by typical aspects of performance of the present invention are briefly explained as follows:

In a semiconductor integrated circuit device adopting the master slice scheme; the inferior conductions between power source wiring lines, the failures of power source wiring lines in connections, etc. can be reduced to enhance an electrical reliability.

Moreover, a term for the development of a semiconductor integrated circuit device adopting a master slice scheme can be shortened.

What is claimed is:

1. A semiconductor integrated circuit device comprising:
   a semiconductor substrate having a principal surface which basic cells are formed on and arranged in a matrix array;
   first power source wiring lines which are arranged over said basic cells, said arrangement being substantially in a first plane above and parallel to said principal surface, and which extend in a first extending direction;
   second power source wiring lines which are arranged over said first power source wiring lines, said arrangement being substantially in a second plane above and parallel to said first plane, and which extend in a second extending direction different from said first extending direction; and
   third power source wiring lines which are arranged over said second power source wiring lines and which extend in said first extending direction;
   wherein second contact holes for connecting the second power source wiring line and the third power source wiring line are arranged, when viewed in plan, around first contact holes for connecting the first power source wiring line and said second power source wiring line, in a region in which said first power source wiring line, said second power source wiring line and said third power source line intersect.

2. A semiconductor integrated circuit device according to claim 1, wherein a width of each said third power source wiring line is larger than a width of each said second power source wiring line, and said width of each said second power source wiring line is larger than a width of each said first power source wiring line.

3. A semiconductor integrated circuit device according to claim 12, wherein a total area of said second contact holes is larger than that of said first contact holes.

4. A semiconductor integrated circuit device according to claim 1, wherein said second contact holes are arranged in those regions within the intersection region which are outside regions lying in the direction of said second power source wiring line extending from said first contact holes.

5. A semiconductor integrated circuit device according to claim 4, wherein an opening size of each said second contact hole is substantially equal to that of each said first contact hole.

6. A semiconductor integrated circuit device according to claim 5, wherein each said basic cell is constructed of complementary MISFETs.

7. A semiconductor integrated circuit device according to claim 6, wherein said basic cells are arranged in a sea-of-gates organization.

8. A semiconductor integrate circuit device according to claim 1, wherein said first, second and third power source wiring lines are power source voltage wiring lines.

9. A semiconductor integrated circuit device according to claim 1, wherein said first, second and third power source wiring lines are reference voltage wiring lines.

10. A semiconductor integrated circuit device according to claim 1, wherein said power source wiring lines are made of metal.

11. A semiconductor integrated circuit device according to claim 1, wherein said second extending direction is substantially perpendicular to said first extending direction.

12. A semiconductor integrated circuit device having a basic cell array which is constructed of basic cells arranging in a matrix array, comprising:
   a semiconductor substrate having a principal surface which basic cells are formed on and arranged in a matrix array;
   first power source wiring lines which are arranged over said basic cells, said arrangement being substantially in a first plane above and parallel to said principal surface, to feed them with a supply voltage of first fixed level, and which extend in a first extending direction;
   second power source wiring lines which are arranged over said first power source wiring lines, said arrangement being substantially in a second plane above and parallel to said first plane, and are electrically connected with said first power source wiring lines through first contact holes, and which extend in a second extending direction different from said first extending direction; and
   third power source wiring lines which are arranged over said second power source wiring lines and are electrically connected with said second power source wiring lines through second contact holes, and which extend in said first extending direction;
   wherein second contact holes are arranged, when viewed in plan, around said first contact holes, in a region in which the first power source wiring line, the second power source wiring line and said third power source wiring line intersect.

13. A semiconductor integrated circuit device according to claim 12, wherein a width of each said third power source wiring line is larger than a width of each said second power source wiring line, and said width of each said second power source wiring line is larger than a width of each said first power source wiring line.

14. A semiconductor integrated circuit device according to claim 13, wherein a total area of said second contact holes is larger than that of said first contact holes.

15. A semiconductor integrated circuit device according to claim 12, wherein said second contact holes are arranged in those regions within the intersection region which are outside regions lying in the direction of said second power source wiring line extending from said first contact holes.

16. A semiconductor integrated circuit device according to claim 15, wherein an opening size of each said second contact hole is substantially equal to that of said each first contact hole.

17. A semiconductor integrated circuit device according to claim 16, wherein each said basic cell is constructed of complementary MISFETs.

18. A semiconductor integrated circuit device according to claim 17, wherein said basic cells are arranged in a sea-of-gates organization.

19. A semiconductor integrated circuit device according to claim 12, wherein said first, second and third power source wiring lines are power source voltage wiring lines.

20. A semiconductor integrated circuit device according to claim 12, wherein said first, second and third power source wiring lines are reference voltage wiring lines.

21. A semiconductor integrated circuit device according to claim 12, wherein said power source wiring lines are made of metal.

22. A semiconductor integrated circuit device comprising:
   a semiconductor substrate having a principal surface which basic cells are formed on and arranged in a matrix array;
   a first insulator film which is formed so as to cover said basic cells;
   first power source wiring lines which are arranged, said arrangement being substantially in a first plane above and parallel to said principal surface, on said first insulator film to feed them with a supply voltage of first fixed level, and which extend in a first extending direction;
   first signal wiring lines which are arranged on said first insulator film;
   a second insulator film which is formed so as to cover said first power source wiring lines and said first signal wiring lines;
   second power source wiring lines which are arranged on said second insulator film, said arrangement being substantially in a second plane above and parallel to said first plane, and are electrically connected with said first power source wiring lines through first contact holes, and which extend in a second extending direction different from said first extending direction;
   second signal wiring lines which are arranged on said second insulator film and are electrically connected with said first signal wiring lines through second contact holes, wherein an opening size of each said second contact hole is equal to that of each said first contact hole;
   a third insulator film which is formed to as to cover said second power source wiring lines and said second signal wiring lines;
   third power source wiring lines which are arranged on said third insulator film, and are electrically connected with said second power source wiring lines through third contact holes, and which extend in said first extending direction; and
   third signal wiring lines which are arranged on said third insulator film and are electrically connected with said second signal wiring lines through fourth contact holes, wherein an opening size of each said fourth contact hole is equal to that of each said third contact hole;
   wherein said third contact holes are arranged, when viewed in plan, around said first contact holes, in a region in which the first power source wiring line, the second power source wiring line and the third power source wiring line intersect.

23. A semiconductor integrated circuit device according to claim 22, wherein a width of each said third power source wiring line is larger than a width of each said second power source wiring line, and said width of each said second power source wiring line is larger than a width of each said first power source wiring line.

24. A semiconductor integrated circuit device according to claim 23, wherein a total area of said third contact holes is larger than that of said first contact holes.

25. A semiconductor integrated circuit device according to claim 13, wherein said third contact holes are arranged in those regions within the intersection region which are outside regions lying in the direction of said second power source wiring line extending from said first contact holes.

26. A semiconductor integrated circuit device according to claim 25, wherein an opening size of said each third contact hole is substantially equal to that of said each first contact hole.

27. A semiconductor integrated circuit device according to claim 26, wherein said each basic cell is constructed of complementary MISFETs.

28. A semiconductor integrated circuit device according to claim 27, wherein said basic cells are arranged in a sea-of-gates organization.

29. A semiconductor integrated circuit device according to claim 28, wherein said first contact holes are arranged in a first region, within the intersection region when viewed in plan, wherein said first power source wiring line and said second power source wiring line are overlapped, and wherein said second contact holes are arranged in second regions except third regions, within the intersection region when viewed in plan which are laying in said second extending direction extending from said first region.

30. A semiconductor integrated circuit device according to claim 22, wherein said first, second and third power source wiring lines are power source voltage wiring lines.

31. A semiconductor integrated circuit device according to claim 29, wherein said first contact holes are arranged in a matrix array within said first region, and said second contact holes are arranged in a matrix array within said second regions.

32. A semiconductor integrated circuit device according to claim 22, wherein said first, second and third power source wiring lines are reference voltage wiring lines.

33. A semiconductor integrated circuit device according to claim 32, wherein said first contact holes are formed in a first inter-layer insulating film which is disposed between said first power source wiring line and said second power source inter-layer insulating film which is disposed between said second power source wiring line and said third power source wiring line.

34. A semiconductor integrated circuit device according to claim 22, wherein said power source wiring lines are made of metal.

35. A semiconductor integrated circuit device according to claim 34, wherein said first power source wiring line is comprised of a first-level metal layer, said second power source wiring line is comprised of a second-level metal layer, and said third power source wiring line is comprised of a third-level metal layer.

* * * * *